(12) United States Patent
Chaichanavong (10) Patent No.: US 9,362,933 B1
(45) Date of Patent: Jun. 7, 2016

(54) NOISE-PREDICTIVE DETECTOR ADAPTATION WITH CORRECTED DATA

(75) Inventor: Panu Chaichanavong, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 33 days.

(21) Appl. No.: 13/546,859

(22) Filed: Jul. 11, 2012

Related U.S. Application Data (60) Provisional application No. 61/507,004, filed on Jul. 12, 2011.

(51) Int. Cl.
*H03D 1/00* (2006.01)
*H03M 1/08* (2006.01)

(52) U.S. Cl.
CPC .................................... *H03M 1/08* (2013.01)

(58) Field of Classification Search
CPC ..... H04L 1/0054; H04L 1/0045; H04L 1/004; H04L 1/00; H03M 13/41; H03M 13/4107; H03M 13/6502; G11B 20/10009
USPC .................................. 375/341, 340, 316, 219
See application file for complete search history.

(56) References Cited

U.S. PATENT DOCUMENTS

| | | | |
|---|---|---|---|
| 5,537,444 A | 7/1996 | Nill | |
| 6,581,182 B1 | 6/2003 | Lee | |
| 6,711,225 B1 | 3/2004 | Sutardja et al. | |
| 7,266,750 B1 | 9/2007 | Patapoutian et al. | |
| 7,310,768 B2 | 12/2007 | Eidson | |
| 7,331,013 B2 | 2/2008 | Rudosky | |
| 7,453,960 B1 | 11/2008 | Wu et al. | |
| 7,467,347 B2 | 12/2008 | Orio | |
| 7,484,158 B2 | 1/2009 | Sharon et al. | |
| 7,571,375 B2 | 8/2009 | Kim et al. | |
| 7,583,751 B1 | 9/2009 | Burd et al. | |
| 7,607,072 B2 | 10/2009 | Ashley | |
| 7,911,364 B1 | 3/2011 | Zhang et al. | |
| 8,006,172 B2 | 8/2011 | Boyer | |
| 8,019,020 B1 | 9/2011 | Chaichanavong | |
| 8,040,953 B2 | 10/2011 | Yang | |
| 8,074,157 B2 | 12/2011 | Haratsch | |
| 8,140,943 B1 | 3/2012 | Wu | |
| 8,205,144 B1 | 6/2012 | Yadav | |

(Continued)

OTHER PUBLICATIONS

Yeo et al., "Iterative Decoder Architectures," *Capacity Approaching Codes, Iterative Decoding Algorithms, and their Applications, IEEE Communications Magazine*, vol. 41, No. 8, pp. 132-140, Aug. 2003.

(Continued)

*Primary Examiner* — Zewdu Kassa (57) ABSTRACT

The present disclosure includes apparatus, systems, and techniques relating to noise-predictive detector adaptation. A described technique includes operating a decoder to decode a received encoded signal based on estimation parameters to produce paths including a first path and a second path, the second path being an alternate to the first path, determining a decoded path based on at least a portion of the paths, determining a winning path of the first path and the second path based on whether the decoded path matches the first path or the second path, and updating the estimation parameters based on one or more error terms and the winning path to favor selection of the winning path by the decoder and to disfavor selection of a losing path of the first and second paths by the decoder in a subsequent iteration.

33 Claims, 7 Drawing Sheets

(56) References Cited

U.S. PATENT DOCUMENTS

| | | | |
|---|---|---|---|
| 8,230,312 | B1 | 7/2012 | Yeo |
| 8,259,872 | B2 | 9/2012 | Wu |
| 8,307,268 | B2 | 11/2012 | Chaichanavong |
| 8,321,771 | B1 | 11/2012 | Yadav |
| 8,407,571 | B2 | 3/2013 | Ashley |
| 8,516,347 | B1 | 8/2013 | Li |
| 8,751,912 | B1 | 6/2014 | Varnica |
| 2005/0190477 | A1 | 9/2005 | Taguchi et al. |
| 2006/0156171 | A1 | 7/2006 | Kuznetsov et al. |
| 2007/0283220 | A1 | 12/2007 | Kim |
| 2008/0052595 | A1 | 2/2008 | Haratsch et al. |
| 2008/0235561 | A1 | 9/2008 | Yang |
| 2008/0282129 | A1 | 11/2008 | Blanksby |
| 2009/0019335 | A1* | 1/2009 | Boyer et al. .................. 714/755 |
| 2009/0150746 | A1 | 6/2009 | Chaichanavong et al. |
| 2009/0313530 | A1* | 12/2009 | Becker et al. ................. 714/792 |
| 2010/0046627 | A1* | 2/2010 | Xiao et al. ............... 375/240.23 |
| 2010/0246733 | A1* | 9/2010 | Fu et al. ........................ 375/341 |

OTHER PUBLICATIONS

Mansour et al., "Memory-Efficient Turbo Decoder Architectures for LDPC Codes," *IEEE Journal of Solid-State Circuits*, vol. 41, No. 3, pp. 684-698, Mar. 2006.

Luby et al., "Improved Low-Density Parity-Check Codes Using Irregular Graphs", IEEE Transactions on Information Theory, vol. 47(2), pp. 585-598, Feb. 2001.

Richardson et al., "The Capacity of Low-Density Parity-Check Codes Under Message-Passing Decoding", IEEE Transactions on Information Theory, vol. 47, Feb. 2001, 599-618.

Richardson et al., "Design of capacity-approaching irregular low-density parity-check codes," IEEE Transactions on Information Theory, vol. 47, pp. 619-637, Feb. 2001.

Kavcic et al., "Binary ISI Channels: Gallager Codes, Density Evolution and Code Performance Bounds", IEEE Transactions on Information Theory, Jul. 2003, 100-118.

\* cited by examiner

NOISE-PREDICTIVE DETECTOR ADAPTATION WITH CORRECTED DATA

CROSS REFERENCE TO RELATED APPLICATION

The present disclosure claims the benefit of the priority of U.S. Provisional Application Ser. No. 61/507,004, filed Jul. 12, 2011, which is incorporated herein by reference in its entirety.

BACKGROUND

The present disclosure describes systems and techniques relating to decoders and decoding techniques.

Basic components of a communication system include a transmitter and a receiver. The transmitter and receiver can communicate over a channel such as a wireless channel, optical channel, or wired channel. Other types of channels are possible. For example, the channel can be a read channel formed by reading encoded information from a surface of a hard drive disk. Factors such as noise corruption and channel distortion can introduce errors into data transmitted by the transmitter. To address such introduced errors, the transmitter can encode data.

SUMMARY

The present disclosure includes apparatus, systems, and techniques relating to noise-predictive detector adaptation. A described technique includes operating a decoder to decode a received encoded signal based on estimation parameters to produce paths including a first path and a second path, the second path being an alternate to the first path, determining a decoded path based on at least a portion of the paths, determining a winning path of the first path and the second path based on whether the decoded path matches the first path or the second path, and updating the estimation parameters based on one or more error terms and the winning path to favor selection of the winning path by the decoder and to disfavor selection of a losing path of the first and second paths by the decoder.

These and other implementations can include one or more of the following features. Updating the estimation parameters can include adjusting the estimation parameters to cause, in the decoder, a decrease in a metric associated with the winning path for a subsequent iteration of the decoder. In some implementations, the paths are associated with respective path metric values where the first path is associated with a smallest one of the path metric values. Implementations can include selecting the second path such that a path metric difference between the first path and the second path is less than a threshold. Implementations can include filtering the received encoded signal to produce sample codewords. The decoder can be configured to use the sample codewords to produce the paths. Determining the decoded path can include applying an error correction code to one or more of the paths to determine a correct path.

Implementations can include determining the estimation parameters based on first estimation parameters and second estimation parameters; and determining the first estimation parameters based on one or more of the sample codewords and a preliminary detection of one or more codewords indicated by the received encoded signal. The first and the second estimation parameters can include filter coefficients and a mean shift parameter.

Updating the estimation parameters can include adjusting the second estimation parameters based on the one or more error terms and the winning path. Updating the estimation parameters can include combining the first estimation parameters and second estimation parameters to produce combined estimation parameters; updating the combined estimation parameters based on the one or more error terms and the winning path to produce updated combined estimation parameters; and updating the second estimation parameters based on the updated combined estimation parameters and the first estimation parameters. Determining the estimation parameters can include combining the first estimation parameters and the second estimation parameters using a normalization technique.

A receiver can include a decoder configured to decode a received encoded signal based on estimation parameters to produce paths including a first path and a second path, the second path being an alternate to the first path. The receiver can include circuitry configured to determine a decoded path based on at least a portion of the paths. Further, the receiver can include an updater configured to perform operations that include determining a winning path of the first path and the second path based on whether the decoded path matches the first path or the second path; and updating the estimation parameters based on one or more error terms and the winning path to favor selection of the winning path by the decoder and to disfavor selection of a losing path of the first and second paths by the decoder in a subsequent iteration.

A decoder can be configured to process the sample codewords by iteratively processing codeword information and exchanging information between a soft output Viterbi algorithm (SOVA) decoder and a low density parity check (LDPC) decoder. The SOVA decoder can be configured to produce the paths based on the estimation parameters. The LDPC decoder can be configured to produce the decoded path. Other types of decoders are possible.

A system can include a filter to produce sample codewords based on a received encoded signal; a decoder configured to decode the sample codewords by iteratively processing codeword information and exchanging information between a soft input soft output (SISO) decoder and a code decoder, and an updater. Decoding the sample codewords can include operating the SISO decoder to produce a first path and a second path based on estimation parameters, the second path being an alternate to the first path, and operating the code decoder to produce a decoded path. The updater can be configured to determine a winning path of the first and second paths based on whether the decoded path matches the first path or the second path and update the estimation parameters based on one or more error terms and the winning path to favor selection of the winning path by the SISO decoder in a subsequent iteration and to disfavor selection of a losing path of the first and second paths by the decoder in the subsequent iteration.

The updater can be configured to perform operations such as determining the estimation parameters based on first estimation parameters and second estimation parameters, determining the first estimation parameters based on one or more of the sample codewords and a preliminary detection of one or more codewords indicated by the received encoded signal, combining the first estimation parameters and second estimation parameters to produce combined estimation parameters; updating the combined estimation parameters based on the one or more error terms and the winning path to produce updated combined estimation parameters; and updating the second estimation parameters based on the updated combined estimation parameters and the first estimation parameters.

Particular embodiments of the technology described in this document can be implemented so as to realize one or more of the following advantages. One or more described technologies can be used to improve a bit-error-rate (BER) performance of a receiver. One or more described techniques can be used to perform noise reduction (NR) estimation in addition to minimum mean square error (MMSE) estimation such that the estimation process is able to quickly converge and track changes in a read channel.

Details of one or more implementations are set forth in the accompanying drawings and the description below. Other features and advantages may be apparent from the description and drawings, and from the claims.

DRAWING DESCRIPTIONS

Like reference symbols in the various drawings indicate like elements.

DETAILED DESCRIPTION

The systems and techniques described herein can be implemented as one or more devices, such as one or more integrated circuit (IC) devices in a wireless communication device, an optical communication device, or a computer readable storage device. For example, the systems and techniques disclosed can be implemented in a wireless local area network (WLAN) transceiver device (e.g., a WLAN chipset) suitable for use in an orthogonal frequency-division multiplexing (OFDM) multiple-input and multiple-output (MIMO) system. Further, the systems and techniques disclosed can be implemented in a computer storage device, such as a hard disk drive or an optical disk drive. For example, one or more described techniques and systems can be used to decode encoded data read from a surface of a magnetic disk.

Figure 1:
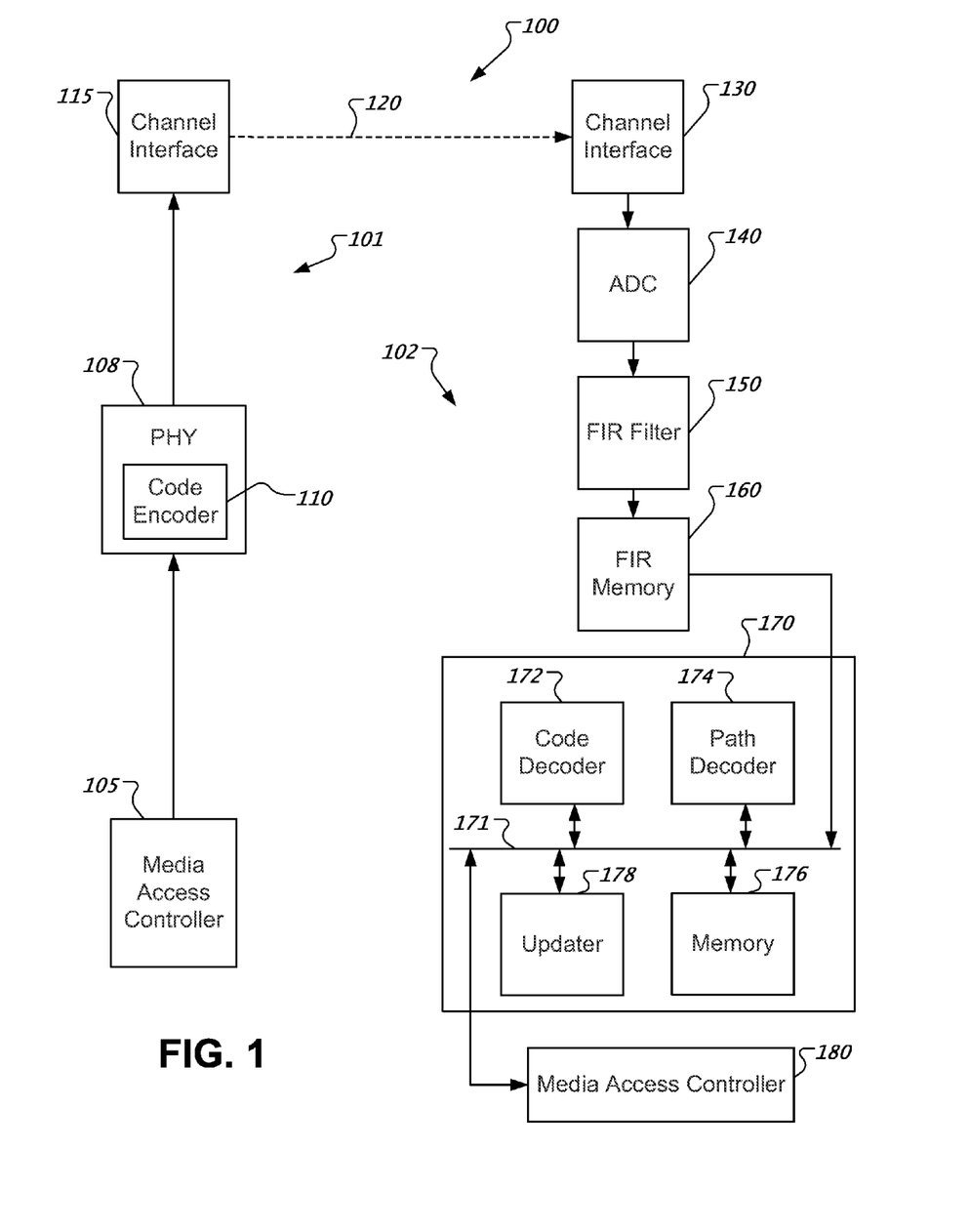
FIG. 1 shows an example architecture of a wireless communication system with a transmitter and a receiver.

FIG. 1 shows an example architecture of a wireless communication system 100 with a transmitter 101 and a receiver 102. The transmitter 101 includes a media access controller (MAC) 105, a physical layer (PHY) 108 that includes a code encoder 110, and a channel interface 115 to transmit data over a channel 120. The MAC 105 can provide user data to the PHY 108 for transmission. The PHY 108 can operate the code encoder 110 to encode data for transmission by using an error correction code (ECC) technique. For example, the code encoder 110 can include an low density parity check (LDPC) encoder or a turbo code encoder. An LDPC code, for example, is an error correcting code used to detect and correct errors when transmitting data over a noisy transmission channel such as channel 120. Other types of encoders are possible. The receiver 102 includes a channel interface 130 to receive data over the channel 120, an analog-to-digital converter (ADC) 140, a finite impulse response (FIR) filter 150, a FIR memory 160, a decoder system 170, and a MAC 180. The MAC 108 can receive decoded user data from the decoder system 170 and can pass the user data to an application process. The decoder system 170 includes a code decoder 172, a path decoder 174, memory 176, an updater 178, and communications bus 171.

In the receiver 102, the analog signal received via the channel 120 is initially filtered by the channel interface 130, and the filtered analog signal is sampled by the ADC 140. The ADC samples are equalized by the FIR filter 150 and provided to the decoder system 170 by way of storing data in the FIR memory 160. In some implementations, the FIR filter 150 can be configured to generate FIR sample codewords from a received encoded signal via the ADC 140 and store the sample codewords in the FIR memory 160.

One or more of the decoders 172, 174 of the decoder system 170 can decode sample codewords, produced by the FIR filter 150, based on estimation parameters. The updater 178 can include one or more estimators to estimate and update the estimation parameters. The estimators can include a minimum mean square error (MMSE) estimator and a noise reduction (NR) estimator. Estimation parameters can include filter coefficients and a mean shift value. Other types of estimation parameters are possible. In some implementations, the filter coefficients are provided to the FIR filter 150.

The path decoder 174 of the decoder system 170 can be a soft input soft output (SISO) decoder such as a Soft Output Viterbi Algorithm (SOVA) decoder or a Bahl-Cocke-Jelinek-Raviv "BCJR" decoder. SOVA, for example, is based on the classical Viterbi algorithm and uses a modified path metric to take into account the a priori probabilities of input symbols or bits and produces a soft output indicating the reliability of a decision about the input symbols. In some implementations, the path decoder 174 is a hard-output based decoder. Various examples of a code decoder 172 include a LDPC decoder and a turbo code decoder. Other types of decoders are possible.

In some implementations, the path decoder 174 and the code decoder 172, are configured to act together as an iterative decoder. For example, the path decoder 174 and the code decoder 172 can both be configured to iteratively process codeword information and pass resulting information back and forth such that each successive iteration improves overall data accuracy. The path decoder 174 receives the FIR sample codewords and, when available, prior information from the code decoder 172. At an initial iteration, the prior information is set to zero for all bits in the iterative codeword. Based on the received FIR sample codewords and the prior information, the path decoder 174 produces reliability information. Reliability information from the path decoder 174 is forwarded to the code decoder 172. The code decoder 172 generates updated reliability information based on code constraints, and sends the updated reliability information back to the path decoder 174. This process is repeated till a stopping criterion has been met.

Figure 2:
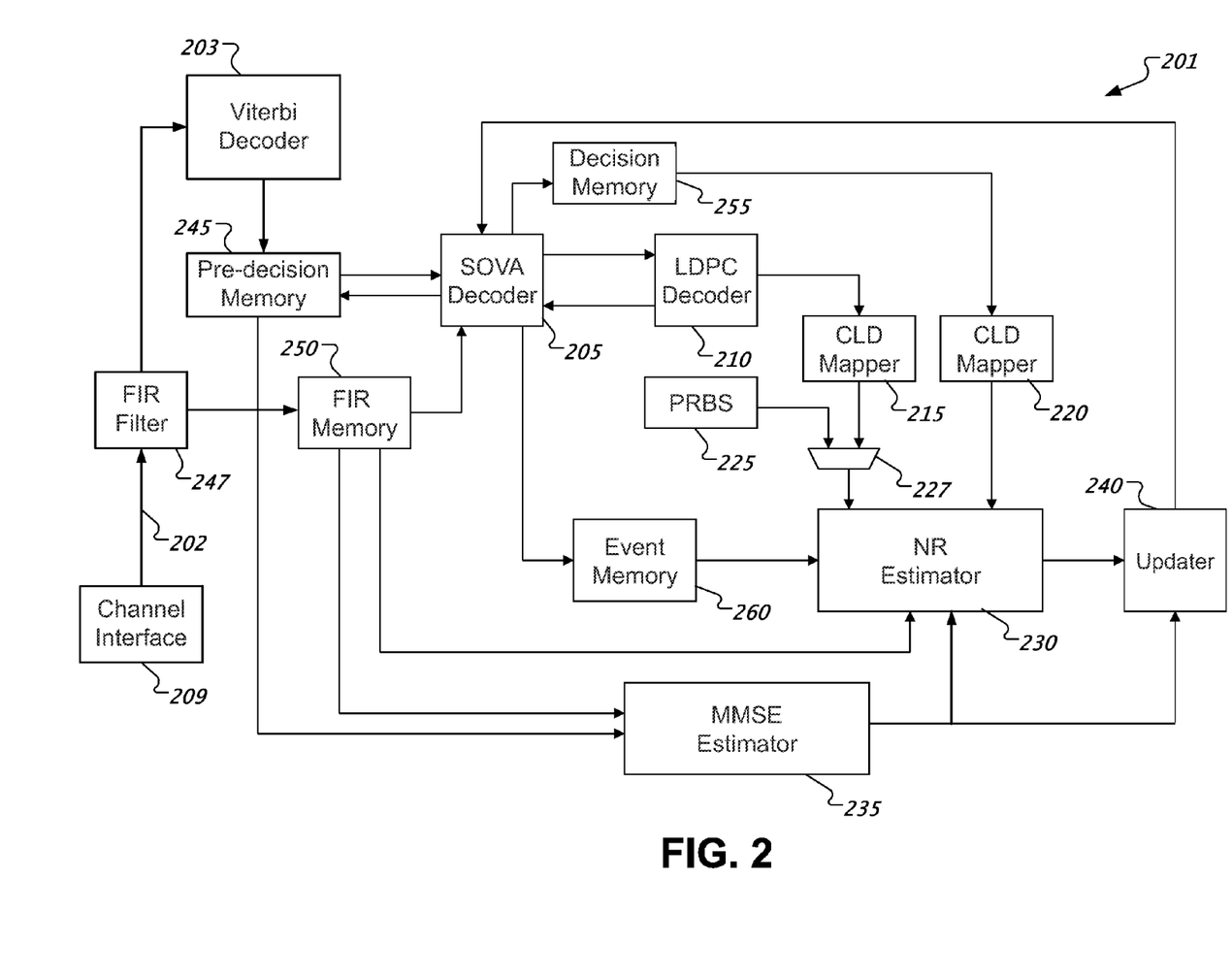
FIG. 2 shows an example of an iterative decoder system.

FIG. 2 shows an example of an iterative decoder system 201. The system 201 includes a Viterbi decoder 203, SOVA decoder 205, LDPC decoder 210, channel LLR decorrelator (CLD) mappers such as a first CLD mapper 215 and a second CLD mapper 220, pseudo-random binary sequence (PRBS) generator 225, selector 227, NR estimator 230, MMSE estimator 235, and updater 240. The system 201 includes memories such as a pre-decision memory 245, FIR memory 250, decision memory 255, and event memory 260. These memories can include storage space for multiple items such as information relating to multiple codewords that are being decoded by the system. In some implementations, the updater 240 includes the NR estimator 230 and the MMSE estimator 235.

A FIR filter 247 processes a digital version of a received encoded signal 202 that is provided via a channel interface 209. In some implementations, the channel interface 209 includes circuitry to couple with one or more antennas for receiving wireless communication signals. In some implementations, the channel interface 209 includes a read channel apparatus for reading data from a surface of a rotatable disk such as a magnetic disk or an optical disk. Based on the received encoded signal 202, the filter 247 produces and stores FIR samples in the FIR memory 250. The FIR filter 247 can be a filter that processes the received encoded signal 202 to produce a signal, for example, whose impulse response settles to zero in a finite number of sample intervals.

The Viterbi decoder 203 processes the FIR samples and produces hard decisions based on the FIR samples for each codeword. These hard decisions at this initial stage of the decoding pipeline can be referred to as pre-decisions. The Viterbi decoder 203 generates hard decision information that includes pre-decision bits and stores the pre-decision bits in the pre-decision memory 245. Since the Viterbi decoder 203 may receive the FIR samples and process the information with a relatively short latency, Viterbi decoder 203 can act as a "preliminary" Viterbi decoder that quickly provides input signals for the rest of the system 201. In this manner, Viterbi decoder 203 may process the FIR samples quickly to help ensure that a channel estimation process converges correctly, while an iterative decoder (including the SOVA decoder 205 and the LDPC decoder 210) may take a longer amount of time and sufficiently checks for errors while decoding the data.

The SOVA decoder 205 produces soft information and path decision information in response to one or more codewords of the encoded signal 202. The SOVA decoder 205 produces a most-likely (ML) path indication which is stored in the decision memory 255. In some implementations, the SOVA decoder 205 updates the pre-decision information in the pre-decision memory 245. The updater 240 loads estimation parameters into the SOVA decoder 205, which then uses the parameters to produce the soft information and path decision information. The SOVA decoder 205 can output one or more alternate paths to the event memory 260. These one or more alternate paths are different from the ML path. Based on output from the SOVA decoder 205, the LDPC decoder 210 can produce a decoded path (which can sometimes be referred to as a "true path" or "true data" or "corrected data"). This decoded path is the best estimate of the codeword based on the current decoding state of the system 201. In some implementations, the ML path is selected by the SOVA decoder 205 to have the smallest path metric and the alternate path is selected to have the second smallest path metric.

The system 201 can employ multiple estimation techniques to improve the reliability of the overall decoding process. These estimation techniques include MMSE estimation and NR estimation. The MMSE estimator 235 produces MMSE estimation parameters based on information stored in the pre-decision memory 245 and the FIR memory 250. The MMSE estimator 235 attempts to minimize square error along a ML path. The NR estimator 230 uses an adaptation technique in conjunction with MMSE estimation to improve the bit-error-rate (BER) performance of the system 201.

The NR estimator 230 uses multiple types of information such as event location information, pre-decision information, alternate path information, ML path information, FIR samples, MMSE estimates, and LDPC decoded data to produce an NR estimation output. The updater 240 can combine the NR estimation parameters and the MMSE estimation parameters to provide combined estimation parameters to the SOVA decoder 205.

The NR estimator 230 uses an adaptation technique that considers whether the decoded path from the LDPC decoder 210 matches a ML path or an alternate path (which is sometimes referred to as a trace back path). If the ML path is the same as the decoded path, the adaptation technique adapts one or more estimation parameters such that the squared-error along the ML path is smaller, but the squared-error along the alternate path is larger. If the alternate path is the same as the decoded path, the technique adapts the one or more estimation parameters such that the squared-error along the ML path is larger, but the squared-error along the alternate path is smaller.

In some implementations, the PRBS generator 225 generates a pseudo-random binary sequence to the NR estimator 230 during a PRBS mode. In a calibration mode, the selector 227 provides the NR estimator 230 with an output of the PRBS generator 225 instead of an output of the first CLD mapper 215. The system 201 can enter a PRBS mode for one or more reasons such as for a calibration purpose or during a period of very low SNR to aid in the convergence of the LDPC decoder 210.

In some implementations, the information passed between the SOVA decoder 205 and the LDPC decoder 210 represents a bit reliability metric, such as a log-likelihood-ratio (LLR) message. The LLR can be obtained using a natural logarithmic function of the ratio of the probability of the value being 1 to the probability of the value being 0 in accordance with this equation:

$$LLR(b_i) = \log\left(\frac{P(b_i = 0)}{P(b_i = 1)}\right)$$

where, $b_i$ represents a bit value. An LLR value can include a sign that indicates whether the transmitted bit is determined to be "0" or "1", and a magnitude representing the confidence of that determination. For example, values of LLR>0 indicate a higher probability that the value of the transmitted bit is 0, whereas values of LLR<0 indicate a higher probability that the value of the transmitted bit is 1.

An LDPC code that can be decoded by the LDPC decoder 210 can be represented using parity check matrices. An (N, K) LDPC code is a parity check code, where K is the number of bits to be encoded, N is the size (or length) of the resulting coded block and M (N−K) represents the additional error correction bits added by the code. Thus, an LDPC code, C, is specified in terms of a low-density (sparse) M-by-N binary parity check matrix H having dimensions M×N. A binary string, c, of length N is a codeword in the LDPC code C, if and only if $Hc = \vec{0}$ is satisfied. For example, $$H = \begin{bmatrix} 1 & 1 & 1 & 1 & 1 & 1 & 1 \\ 1 & 0 & 1 & 0 & 1 & 0 & 1 \\ 0 & 1 & 0 & 1 & 0 & 1 & 0 \end{bmatrix}$$

where the parity check matrix H is shown for an LDPC code with N=7 and K=5. Then, the binary string $c=(1,0,1,0,1,0,1)^T$ is a codeword in the LDPC code C. The codeword, c, is generated by introducing redundancy bits. For example, an LDPC encoder receives a word of length K and outputs a codeword (e.g., codeword c) of length N by inserting N-K redundancy bits into the received word. Each bit of an LDPC codeword, c, corresponds to a column of the parity check matrix H. For example, bit 1 corresponds to the 1st column of matrix H, bit 2 corresponds to the second column of matrix H, etc.

A receiver system, in general, can use an array of bits on a path at time t, where $a_t$ represents the bit value on a path at time t, to determine an error term for a branch. For example, the system computes the error term of a branch with data $a_{t-4}, \ldots, a_t$ in accordance with the following equation:

$$err = \sum_{k=0}^{3}(f_{MMSE,k}(a_{t-3}^t) + f_{NR,k}(a_{t-3}^t))(y_{t-k} - L(p_k) - m_{MMSE}(p_k) - m_{NR}(p_k))$$

where $f_{MMSE,k}(x)$ represents a MMSE non-linear filter coefficient k of state x; $f_{NR,k}(x)$ represents the NR non-linear filter coefficient k of state x; $m_{MMSE}(x)$ represents the MMSE mean shift of state x; $m_{NR}(x)$ represents the NR mean shift of state x; and $y_t$ represents the FIR sample at time t. In some implementations, there are four MMSE non-linear filter coefficients and four NR non-linear filter coefficients per state. The 5-bit patterns $p_0$ to $p_3$ are computed in accordance with the following:

$p_0 = a_{t-4}a_{t-3}a_{t-2}a_{t-1}a_t$ $p_1 = b_{t-5}a_{t-4}a_{t-3}a_{t-2}a_{t-1}$ $p_2 = b_{t-6}b_{t-5}a_{t-4}a_{t-3}a_{t-2}$ $p_3 = b_{t-7}b_{t-6}b_{t-5}a_{t-4}a_{t-3}$ where $b_t$ represents the pre-decision bit from a preliminary Viterbi decoder (e.g., Viterbi decoder 203 of FIG. 2) at time t.

The system applies an ECC technique to a decoding output to produce a correct path. The decoding output can include multiple paths through a trellis. The system uses an update technique based on the correct path and a signed least mean squares (LMS) technique to update a mean shift parameter in accordance with the following equation:

$m_{NR}(p_k) \Leftarrow m_{NR}(p_k) \pm \mu_m \text{sgn}(\text{err})(f_{MMSE,k}(a_{t-3}^t) + f_{NR,k}(a_{t-3}^t))$ where $\mu_m$ is an update weight value for the mean shift parameter. For mean shift, the system uses the plus direction if the branch is on the correct path, otherwise the system uses the minus direction if the branch is on the wrong path. The system can update filter coefficients in accordance with the following equation:

$f_{NR,k}(a_{t-3}^t) \Leftarrow f_{NR,k}(a_{t-3}^t) \mp \mu_f \text{sgn}(\text{err})(y_{t-k} - L(p_k) - m_{MMSE}(p_k) - m_{NR}(p_k))$ where $\mu_f$ is an update weight value for the filter coefficients. The system uses the minus direction if the branch is on the correct path, otherwise the system uses the plus direction if the branch is on the wrong path.

The system can maintain separate sets of estimation parameters such as filter coefficients and mean shift values. In some implementations, the system can share the same parameters between MMSE and NR estimation. In this case, the system can start with MMSE estimation; after a few iterations, switch off MMSE estimation; and then run NR estimation. In some implementations, the system computes the sums:

$f_{total,k}(x) = f_{MMSE,k}(x) + f_{NR,k}(x)$, $m_{total}(x) = m_{MMSE}(x) + m_{NR}(x)$ where the system adapts the resulting combination of the filter parameters and the resulting combination of the mean shift parameters. Based on these sums, the system computes $$err = \sum_{k=0}^{3}(f_{total,k}(a_{t-3}^t))(y_{t-k} - L(p_k) - m_{total}(p_k))$$

for the error term. The system computes $m_{total}(p_k) \Leftarrow m_{total}(p_k) \pm \mu_m \text{sgn}(\text{err})(f_{total,k}(a_{t-3}^t))$ for the $m_{total}$ updates and $f_{total,k}(a_{t-3}^t) \Leftarrow f_{total,k}(a_{t-3}^t) \mp \mu_f \text{sgn}(\text{err})(y_{t-k} - L(p_k) - m_{total}(p_k))$ for the $f_{total}$ updates. The system computes back the NR parameters in accordance with:

$f_{NR,k}(x) = f_{total,k}(x) - f_{MMSE,k}(x)$ $m_{NR}(x) = m_{total}(x) - m_{MMSE}(x)$ at the end of adaptation.

In some implementations, there is no NR estimation for variance. Note that there is an indirect effect to variance because NR estimation adapts the 0th filter tap $f_{NR,0}(x)$, where MMSE does not adapt the 0th tap because it can be fixed to one. Since all taps are adapted by NR estimation, the taps can go to zero or diverge. Hence, a receiver system can periodically normalize the estimation parameters. In some implementations, the receiver system can use the following equation $$\hat{\alpha} = \max_{a=0000}^{1111}(f_{MMSE,0}(a) + f_{NR,0}(a))$$

to find the maximum 0th tap value ($\hat{\alpha}$). The system can perform a division where $\beta = 1/\hat{\alpha}$ is computed. In some implementations, this division does not have to be accurate, however $\beta \leq 1/\hat{\alpha}$ should hold with any less-accurate division procedure so that the new combined nonlinear coefficient is less than or equal to one. The system can normalize taps in accordance with the equation $f_{NR,k}(a) \Leftarrow -f_{MMSE,k}(a) + \beta(f_{MMSE,k}(a) + f_{NR,k}(a))$ for all tap values (e.g., 0000 to 1111) and all k values (0, 1, 2, and 3).

Figure 3:
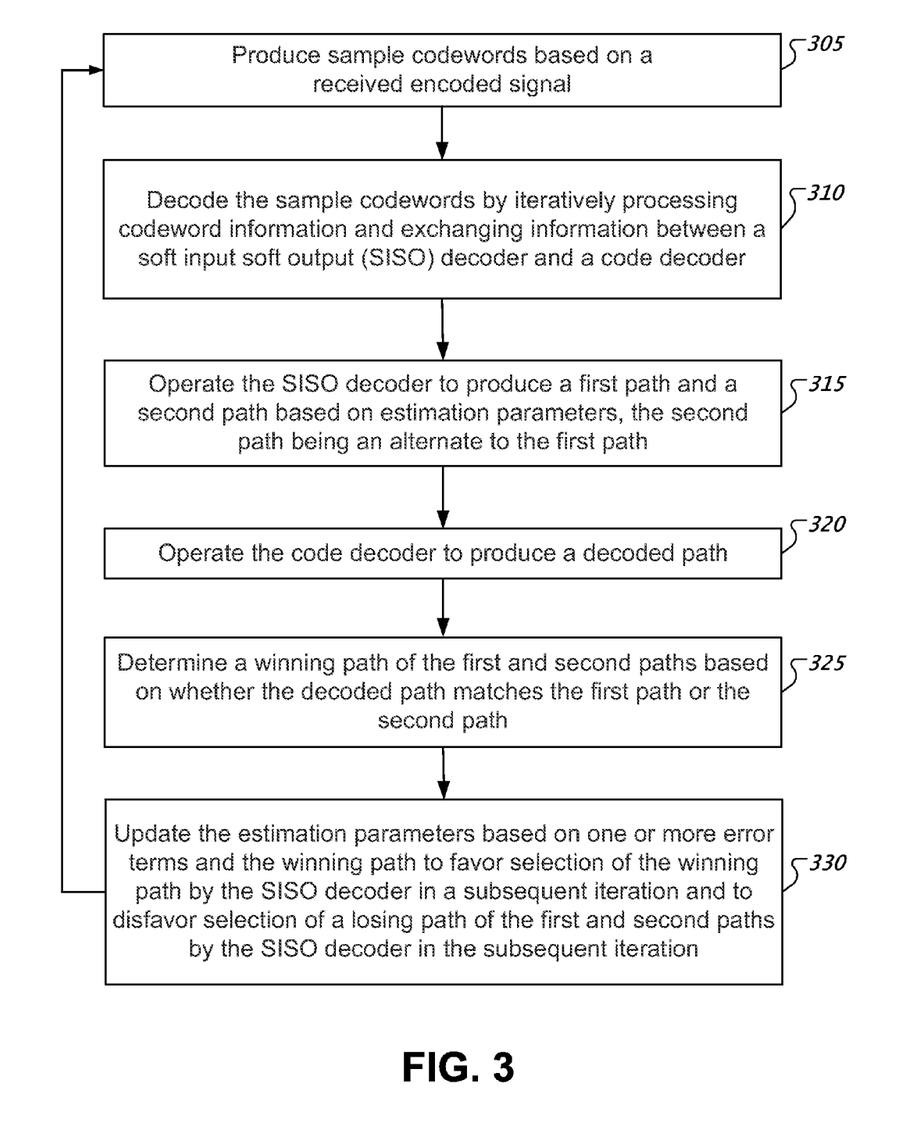
FIG. 3 shows an example of a receiver system process that includes performing an adaptation technique.

FIG. 3 shows an example of a receiver system process that includes performing an adaptation technique. In some implementations, the process periodically performs adaptation to adjust estimation parameters for decoding received signals. In some implementations, the process continuously performs adaptation to adjust estimation parameters for decoding received signals. At 305, the process produces sample codewords based on a received encoded signal. Producing sample codewords can include operating a FIR filter to determine FIR sample codewords. At 310, the process decodes the sample codewords by iteratively processing codeword information and exchanging information between a soft input soft output (SISO) decoder (e.g., SOVA decoder or a BCJR decoder) and a code decoder (e.g., LDPC decoder or a turbo code decoder). At 315, the process operates the SISO decoder to produce a first path and a second path based on estimation parameters, the second path being an alternate to the first path. The paths can be generated based on different paths of bits defined on a trellis structure. The process can select a next bit of a path on the trellis structure based on a branch metric (e.g., the probability of the next bit being a "1" is associated with a first branch metric value, where the probability of the next bit being a "0" is associated with a second, different branch metric value). A path metric can be defined as a sum of individual branch metric values. For example, the paths can be associated with respective path metric values where the first path can be associated with a smallest one of the path metrics. The SISO decoder can select the second path such that a path metric difference between the first path and the second path is less than a threshold. For example, the second path has the second smallest path metric. At 320, the process operates the code decoder to produce a decoded path.

At 325, the process determines a winning path of the first and second paths based on whether the decoded path matches the first path or the second path. At 330, the process updates the estimation parameters based on one or more error terms and the winning path to favor selection of the winning path by the SISO decoder in a subsequent iteration and to disfavor selection of a losing path of the first and second paths by the SISO decoder in the subsequent iteration. Updates estimation parameters can include updating a first set of estimation parameters and updating a second set of estimation parameters. Each of the first estimation parameters and second estimation parameters can include filter coefficients for a filter such as a FIR filter and a mean shift parameter. In some implementations, the second set of estimation parameters is considered to be a fine-grain adjustment to the first set of estimation parameters. After updating the estimation parameters at 330, the process can continue at 305 to produce additional sample codewords. In some implementations, the process causes the SISO decoder to reprocess codewords based on the updated estimation parameters.

Figure 4:
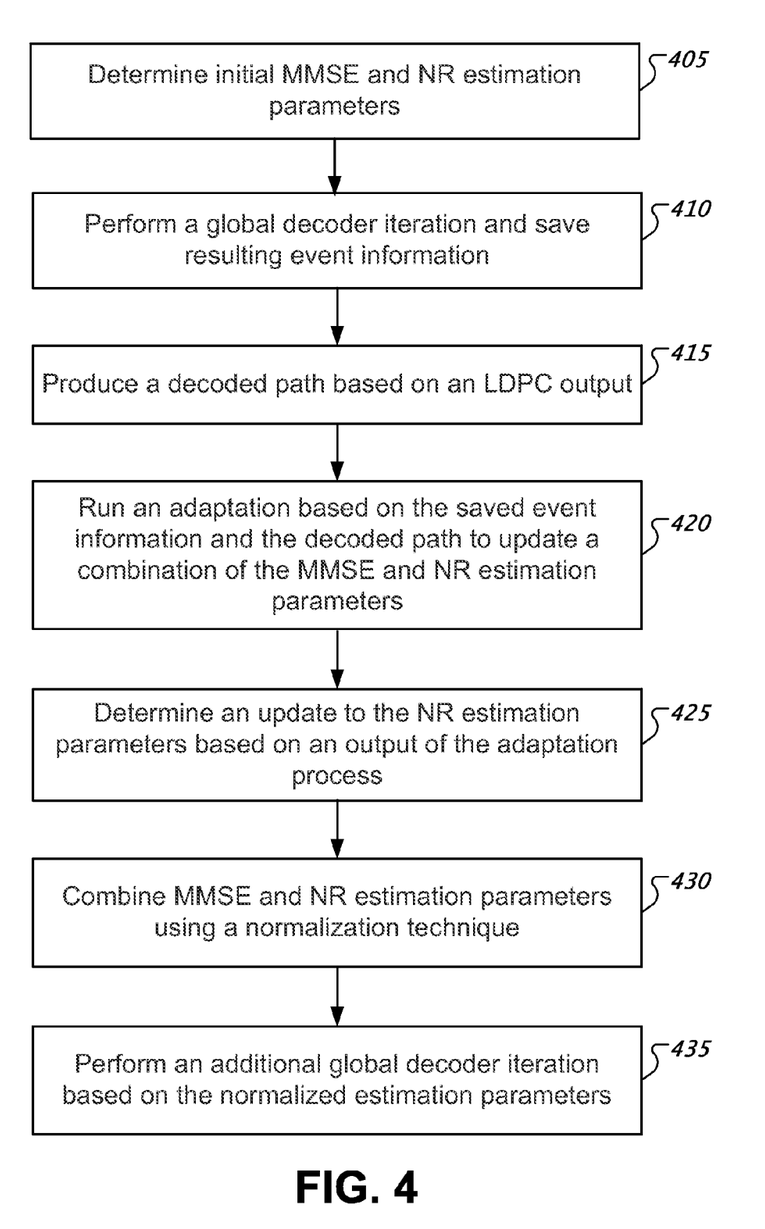
FIG. 4 shows another example of a receiver system process that includes performing an adaptation technique.

FIG. 4 shows another example of a receiver system process that includes performing an adaptation technique. At 405, a receiver system process determines the initial MMSE and NR estimation parameters. At 410, a global decoder iteration is performed and resulting event information is saved. At 415, the process produces a decoded path based on an LDPC output. At 420, the process runs an adaptation based on the saved event information and the decoded path to update a combination of the MMSE and NR estimation parameters. At 425, the process determines an update to the NR estimation parameters based on an output of the adaptation process. At 430, the process combines MMSE and NR estimation parameters using a normalization technique, such as described above. At 435, the process performs an additional global decoder iteration based on the normalized estimation parameters.

Figure 5:
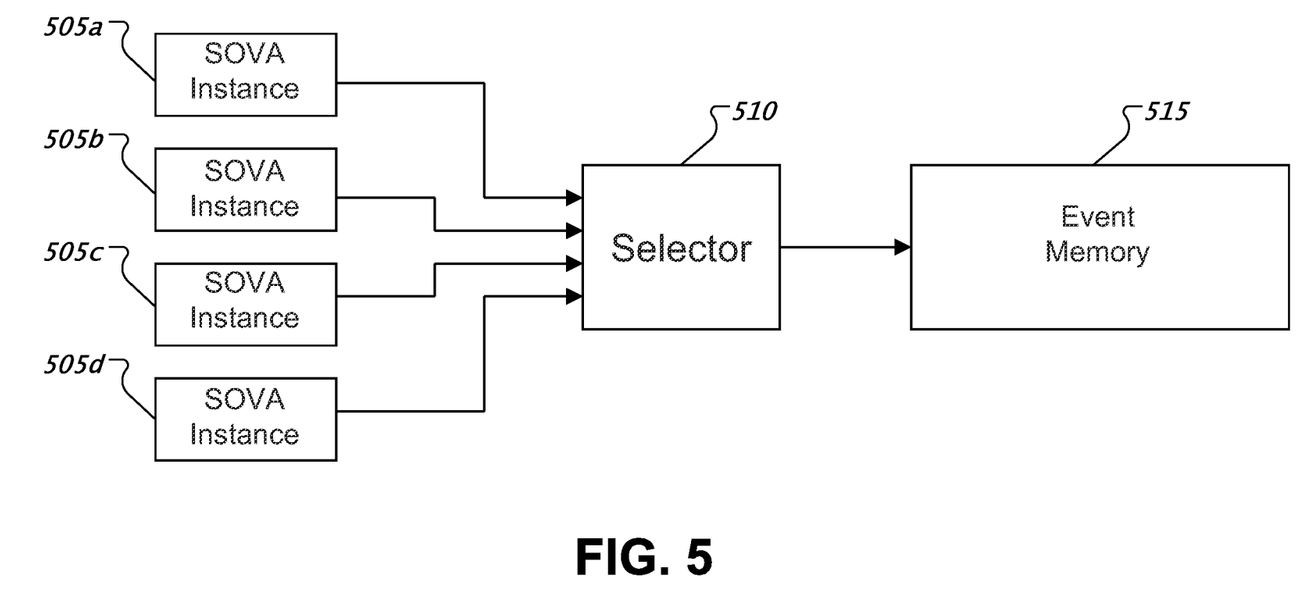
FIG. 5 shows an example of selecting and storing event information from multiple decoder instances.

FIG. 5 shows an example of selecting and storing event information from multiple SOYA instances. A SOYA decoder can include hardware that operates multiple SOYA instances 505a-d. Each of the SOYA instances 505a-d can be configured to simultaneously process different sections of each sample codeword and produce events. In some implementations, the SOYA instances 505a-d produce events that merge directly to the ML path. A selector 510 can select events from the SOYA instances 505a-d based on comparing metric values with a predetermined threshold value, and write the selected events to an event memory 515. In some implementations, the selector 510 selects one of the events from the SOYA instances 505a-d and writes the selected one to the event memory 515. Some receivers use a clock period of 4 T. Further, one or more memories 515 of a receiver can run at a 4 T clock period. For each 4 T cycle, each SOYA instance 505a-d produces two events for a total of eight events. Each event can be associated with a metric such as a path metric. In some implementations, the selector 510 selects the event with the smallest path metric value and stores the selected event to the memory 515.

Figure 6:
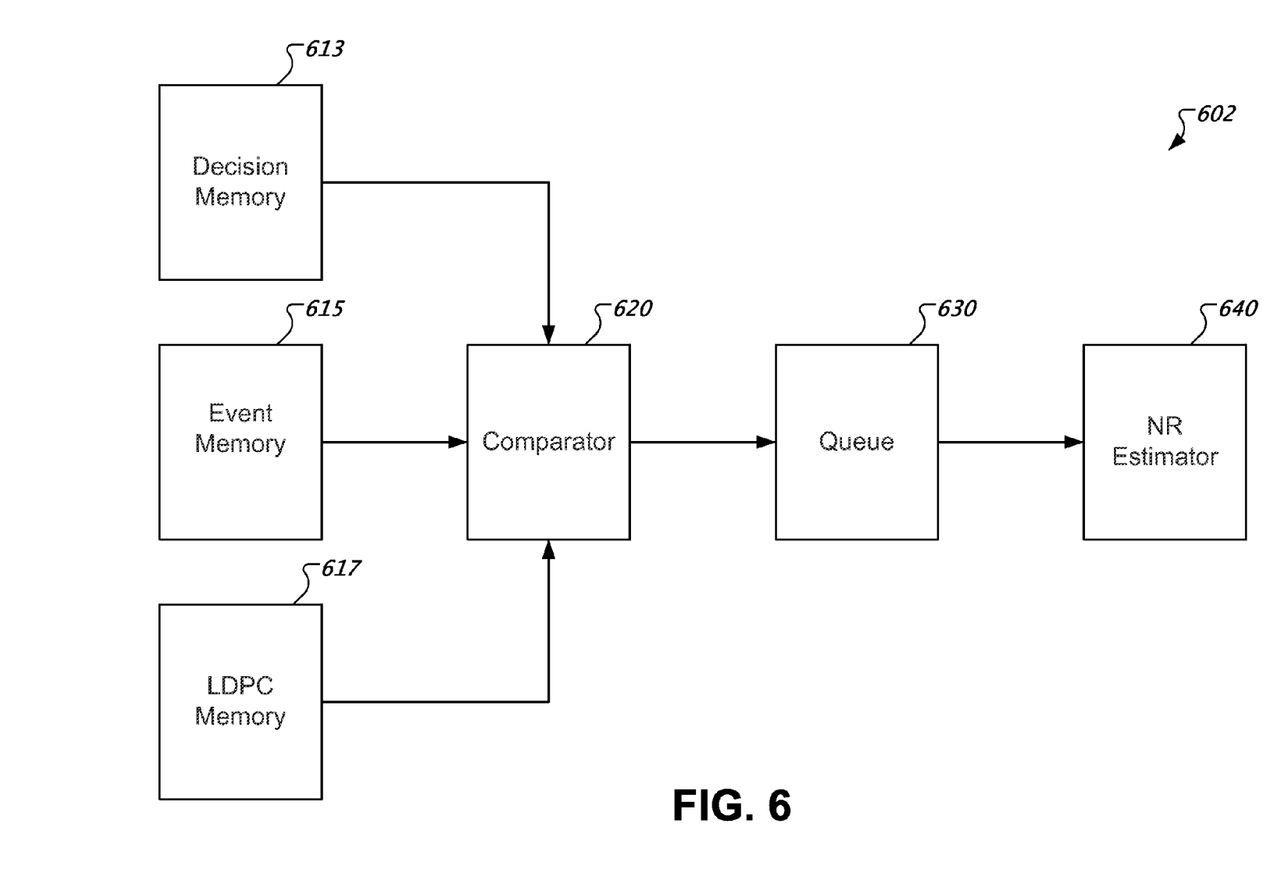
FIG. 6 shows an example of an event comparator of a receiver architecture.

FIG. 6 shows an example of an event comparator of a receiver architecture. The receiver architecture 602 includes a decision memory 613, event memory 615, LDPC memory 617, an event comparator 620, queue 630, and NR estimator 640. The NR estimator 640 uses multiple types of information such as event location information, pre-decision information, alternate path information, ML path information, FIR samples, and LDPC decoded data to produce an NR estimation output. The information can be stored in one or more memories 613, 615, 617 of a receiver.

Memories such as the decision memory 613, event memory 615, and LDPC memory 617 provide data to a comparator 620. Based on an output from a LDPC decoder, the LDPC memory 617 can provide a decoded path to the comparator 620. Based on an output from a SOYA decoder, the decision memory 613 can provide ML path information to the comparator 620. Also based on an output from a SOYA decoder, the event memory 615 can provide an input event that includes event location information, pre-decision information (e.g., pre-decision bits), and alternate path information. In some implementations, event location information for a single event includes a SOYA chunk index value and an offset value for a start of a location within the identified SOYA chunk.

In response to an input event received via event memory 615, the comparator 620 receives ML path data from the decision memory 613, a decoded path from the LDPC memory 617, and an alternate path from the event memory 615. The comparator 620 compares the decoded path with the ML path and an alternate path. If the decoded path does not equal the ML path and the decoded path does not equal the alternative path, the comparator 620 discards the input event. Otherwise, the comparator 620 writes event information into the queue 630. The event information includes the input event, ML path, and a path indication as to whether the decoded path matches the ML path or the alternate path. The queue 630 buffers information for the NR estimator 640. The NR estimator 640 can use the path indication to update one or more estimation parameters as described above.

Figure 7:
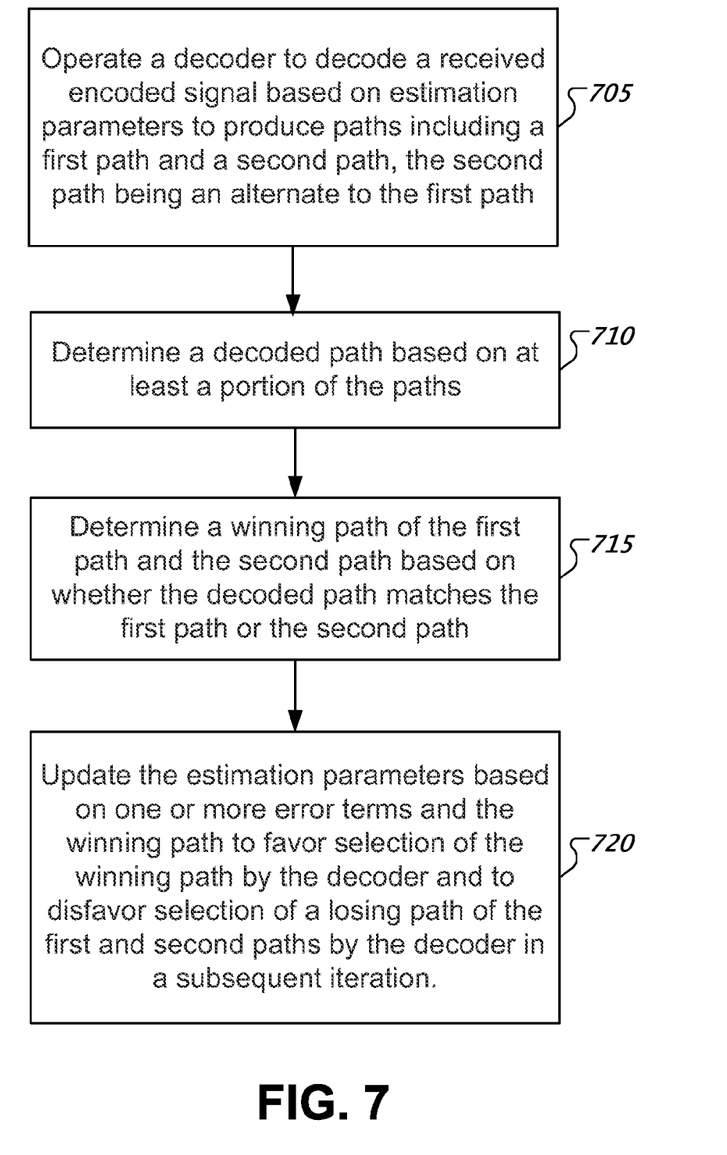
FIG. 7 shows another example of a receiver system process that includes performing an adaptation technique.

FIG. 7 shows another example of a receiver system process that includes performing an adaptation technique. At 705, the process operates a decoder to decode a received encoded signal based on estimation parameters to produce paths including a first path and a second path, the second path being an alternate to the first path. In some implementations, the paths are associated with respective path metrics where the first path is associated with a smallest one of the path metrics. Implementations can include selecting the second path such that a path metric difference between the first path and the second path is less than a threshold. The process can include determining an initial version of the estimation parameters based on first estimation parameters and second estimation parameters. In some implementations, the decoder includes a hard-output decoder such as a Reed-Solomon code decoder or a Bose-Ray-Chaudhuri "BCH" code decoder. In some implementations, the decoder includes a LDPC decoder or a turbo code decoder. In some implementations, the decoder includes an iterative decoder that includes a first decoder and a second decoder. At 710, the process determines a decoded path based on at least a portion of the paths. Determining the decoded path can include applying an error correction code to the paths to determine a correct path. In some implementations, an LDPC decoder can be used to produce the decoded path.

At 715, the process determines a winning path of the first path and the second path based on whether the decoded path matches the first path or the second path. At 720, the process updates the estimation parameters based on one or more error terms and the winning path to favor selection of the winning path by the decoder and to disfavor selection of a losing path of the first and second paths by the decoder in a subsequent iteration. Updating the estimation parameters can include adjusting the estimation parameters to cause, in the decoder, a decrease in a metric associated with the winning path for the subsequent iteration. Updating the estimation parameters can include adjusting the estimation parameters to cause, in the decoder, an increase in a metric associated with the losing path for the subsequent iteration. In some implementations, a subsequent iteration of a decoder refers to the decoder processing the next codeword. The process can update estimation parameters based on a codeword being fully and successfully decoded by the decoder. In some implementations, if the process detects a decoding failure for a received codeword, then the decoder is not required to update the estimation parameters. In some implementations, a subsequent iteration of a decoder refers to the decoder processing the same codeword in an additional iteration, or processing the next codeword.

Updating the estimation parameters, at 720, can include combining the first estimation parameters and second estimation parameters to produce combined estimation parameters; updating the combined estimation parameters based on the one or more error terms and the winning path to produce updated combined estimation parameters. The process can include updating the second estimation parameters based on the updated combined estimation parameters and the first estimation parameters. Determining estimation parameters for a subsequent iteration can include combining the first estimation parameters and an updated version of the second estimation parameters using a normalization technique.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A method comprising:
   operating a decoder to decode a received encoded signal based on estimation parameters to produce paths associated with a codeword indicated by the received encoded signal, the paths including a first path and a second path, the second path being an alternate to the first path;
   determining a decoded path based on at least a portion of the paths;
   determining a winning path of the first path and the second path based on whether the decoded path matches the first path or the second path; and
   updating, for a subsequent iteration of the decoder to process the codeword, the estimation parameters based on one or more error terms and the winning path to favor selection of the winning path by the decoder and to disfavor selection of a losing path of the first and second paths by the decoder.

2. The method of claim 1, wherein the paths are associated with respective path metrics, wherein the first path is associated with a smallest one of the path metrics, the method further comprising:
   selecting the second path such that a path metric difference between the first path and the second path is less than a threshold.

3. The method of claim 1, wherein updating the estimation parameters comprises adjusting the estimation parameters to cause, in the decoder, a decrease in a metric associated with the winning path for the subsequent iteration.

4. The method of claim 1, further comprising:
  filtering the received encoded signal to produce sample codewords, wherein the decoder is configured to use the sample codewords to produce the paths;
  determining the estimation parameters based on first estimation parameters and second estimation parameters, wherein the first and the second estimation parameters comprise filter coefficients and a mean shift parameter; and
  determining the first estimation parameters based on one or more of the sample codewords and a preliminary detection of the codeword indicated by the received encoded signal.

5. The method of claim 4, wherein updating the estimation parameters comprises adjusting the second estimation parameters based on the one or more error terms and the winning path.

6. The method of claim 4, wherein updating the estimation parameters comprises:
  combining the first estimation parameters and second estimation parameters to produce combined estimation parameters;
  updating the combined estimation parameters based on the one or more error terms and the winning path to produce updated combined estimation parameters; and
  updating the second estimation parameters based on the updated combined estimation parameters and the first estimation parameters.

7. The method of claim 4, wherein determining the estimation parameters comprises combining the first estimation parameters and the second estimation parameters using a normalization technique.

8. The method of claim 1, wherein determining the decoded path comprises applying an error correction code to one or more of the paths.

9. An apparatus, comprising:
  a decoder configured to decode a received encoded signal based on estimation parameters to produce paths associated with a codeword indicated by the received encoded signal, the paths including a first path and a second path, the second path being an alternate to the first path;
  circuitry configured to determine a decoded path based on at least a portion of the paths; and
  an updater configured to perform operations comprising:
    determining a winning path of the first path and the second path based on whether the decoded path matches the first path or the second path; and
    updating, for a subsequent iteration of the decoder to process the codeword, the estimation parameters based on one or more error terms and the winning path to favor selection of the winning path by the decoder and to disfavor selection of a losing path of the first and second paths by the decoder.

10. The apparatus of claim 9, wherein the paths are associated with respective path metric values, wherein the first path is associated with a smallest one of the path metrics, and wherein the operations further comprise selecting the second path such that a path metric difference between the first path and the second path is less than a threshold.

11. The apparatus of claim 9, wherein updating the estimation parameters comprises adjusting the estimation parameters to cause, in the decoder, a decrease in a metric associated with the winning path for the subsequent iteration.

12. The apparatus of claim 9, further comprising:
  a filter to produce sample codewords, wherein the decoder is configured to use the sample codewords to produce the paths.

13. The apparatus of claim 12, wherein the operations further comprise:
  determining the estimation parameters based on first estimation parameters and second estimation parameters, wherein the first and the second estimation parameters comprise filter coefficients and a mean shift parameter; and
  determining the first estimation parameters based on one or more of the sample codewords and a preliminary detection of the codeword indicated by the received encoded signal.

14. The apparatus of claim 13, wherein updating the estimation parameters comprises adjusting the second estimation parameters based on the one or more error terms and the winning path.

15. The apparatus of claim 13, wherein updating the estimation parameters comprises:
  combining the first estimation parameters and second estimation parameters to produce combined estimation parameters;
  updating the combined estimation parameters based on the one or more error terms and the winning path to produce updated combined estimation parameters; and
  updating the second estimation parameters based on the updated combined estimation parameters and the first estimation parameters.

16. The apparatus of claim 13, wherein determining the estimation parameters comprises combining the first estimation parameters and the second estimation parameters using a normalization technique.

17. The apparatus of claim 12, wherein the decoder is configured to process the sample codewords by iteratively processing codeword information and exchanging information between a soft output Viterbi algorithm (SOVA) decoder and a low density parity check (LDPC) decoder, wherein the SOVA decoder is configured to produce the paths based on the estimation parameters, and wherein the LDPC decoder is configured to produce the decoded path.

18. A system comprising:
  a filter to produce sample codewords based on a received encoded signal;
  a decoder configured to decode the sample codewords by iteratively processing codeword information and exchanging information between a soft input soft output (SISO) decoder and a code decoder, wherein decoding the sample codewords comprises operating the SISO decoder to produce a first path and a second path based on estimation parameters, the second path being an alternate to the first path, and operating the code decoder to produce a decoded path; and
  an updater configured to determine a winning path of the first and second paths based on whether the decoded path matches the first path or the second path, and to update the estimation parameters based on one or more error terms and the winning path to favor selection of the winning path by the SISO decoder and to disfavor selection of a losing path of the first and second paths by the SISO decoder.

19. The system of claim 18, wherein the paths are associated with respective path metric values, wherein the first path is associated with a smallest one of the path metrics, and wherein the decoder is configured to select the second path such that a path metric difference between the first path and the second path is less than a threshold.

20. The system of claim 18, wherein the updater is configured to perform operations comprising:
   determining the estimation parameters based on first estimation parameters and second estimation parameters, wherein the first and the second estimation parameters comprise filter coefficients and a mean shift parameter;
   determining the first estimation parameters based on one or more of the sample codewords and a preliminary detection of one or more codewords indicated by the received encoded signal;
   combining the first estimation parameters and second estimation parameters to produce combined estimation parameters;
   updating the combined estimation parameters based on the one or more error terms and the winning path to produce updated combined estimation parameters; and
   updating the second estimation parameters based on the updated combined estimation parameters and the first estimation parameters.

21. A method comprising:
   filtering a received encoded signal to produce sample codewords;
   producing preliminary decisions for the sample codewords;
   determining estimation parameters based on the sample codewords and the preliminary decisions, wherein the estimation parameters comprise filter coefficients and a mean shift parameter;
   operating a decoder to decode the sample codewords based on the estimation parameters to produce paths comprising a first path and a second path, the second path being an alternate to the first path;
   determining a decoded path based on at least a portion of the paths; and
   adapting the estimation parameters based on one or more error terms and a winning path to favor selection of the winning path by the decoder and to disfavor selection of a losing path by the decoder, the winning path being a path of the paths that matches the decoded path, the losing path being a path of the paths that does not match the decoded path.

22. The method of claim 21, wherein the estimation parameters comprise first estimation parameters and second estimation parameters, wherein the first estimation parameters are based on the sample codewords and the preliminary decisions, and wherein the second estimation parameters are adapted based on the one or more error terms and the winning path.

23. The method of claim 21, wherein the estimation parameters comprise first estimation parameters and second estimation parameters, and wherein adapting the estimation parameters comprises:
   combining the first estimation parameters and second estimation parameters to produce combined estimation parameters;
   updating the combined estimation parameters based on the one or more error terms and the winning path to produce updated combined estimation parameters; and
   updating the second estimation parameters based on the updated combined estimation parameters and the first estimation parameters.

24. The method of claim 21, wherein adapting the estimation parameters comprises adjusting the estimation parameters to decrease an error associated with the winning path and to increase an error associated with the losing path.

25. An apparatus comprising:
   a filter to produce sample codewords based on a received encoded signal;
   a first decoder configured to produce preliminary decisions for the sample codewords;
   circuitry configured to determine estimation parameters based on the sample codewords and the preliminary decisions, wherein the estimation parameters comprise filter coefficients and a mean shift parameter;
   a second decoder to decode the sample codewords based on the estimation parameters to produce paths comprising a first path and a second path, the second path being an alternate to the first path;
   a third decoder configured to determine a decoded path based on at least a portion of the paths; and
   an updater configured to adapt the estimation parameters based on one or more error terms and a winning path to favor selection of the winning path by the second decoder and to disfavor selection of a losing path by the second decoder, the winning path being a path of the paths that matches the decoded path, the losing path being a path of the paths that does not match the decoded path.

26. The apparatus of claim 25, wherein the estimation parameters comprise first estimation parameters and second estimation parameters, wherein the first estimation parameters are based on the sample codewords and the preliminary decisions, and wherein the second estimation parameters are adapted based on the one or more error terms and the winning path.

27. The apparatus of claim 25, wherein the estimation parameters comprise first estimation parameters and second estimation parameters, and wherein the updater is configured to perform operations comprising:
   combining the first estimation parameters and second estimation parameters to produce combined estimation parameters;
   updating the combined estimation parameters based on the one or more error terms and the winning path to produce updated combined estimation parameters; and
   updating the second estimation parameters based on the updated combined estimation parameters and the first estimation parameters.

28. The apparatus of claim 25, wherein the updater is configured to perform operations comprising adjusting the estimation parameters to decrease an error associated with the winning path and to increase an error associated with the losing path.

29. The apparatus of claim 25, comprising:
   an iterative decoder that contains the second decoder and the third decoder.

30. A system comprising:
   a filter to produce sample codewords based on a received encoded signal;
   a hard decoder configured to produce preliminary decisions for the sample codewords;
   an iterative decoder configured to decode the sample codewords by iteratively processing codeword information and exchanging information between a soft input soft output (SISO) decoder and a code decoder, wherein the SISO decoder is configured to produce paths based on estimation parameters, the paths comprising a first path and a second path, the second path being an alternate to the first path, wherein the code decoder is configured to produce a decoded path based on at least a portion of the paths; and circuitry configured to determine the estimation parameters based on the sample codewords and the preliminary decisions, and adapt the estimation parameters based on one or more error terms and a winning path to favor selection of the winning path by the SISO decoder and to disfavor selection of a losing path by the SISO decoder, the winning path being a path of the paths that matches the decoded path, the losing path being a path of the paths that does not match the decoded path.

31. The system of claim 30, wherein the estimation parameters comprise first estimation parameters and second estimation parameters, wherein the first estimation parameters are based on the sample codewords and the preliminary decisions, and wherein the second estimation parameters are adapted based on the one or more error terms and the winning path.

32. The system of claim 30, wherein the estimation parameters comprise first estimation parameters and second estimation parameters, and wherein the circuitry is configured to perform operations comprising:

combining the first estimation parameters and second estimation parameters to produce combined estimation parameters;

updating the combined estimation parameters based on the one or more error terms and the winning path to produce updated combined estimation parameters; and     updating the second estimation parameters based on the updated combined estimation parameters and the first estimation parameters.

33. The system of claim 30, wherein the circuitry is configured to perform operations comprising adjusting the estimation parameters to decrease an error associated with the winning path and to increase an error associated with the losing path.

\* \* \* \* \*